(12) United States Patent
Furukawa et al.

(10) Patent No.: US 7,984,353 B2
(45) Date of Patent: *Jul. 19, 2011

(54) TEST APPARATUS, TEST VECTOR GENERATE UNIT, TEST METHOD, PROGRAM, AND RECORDING MEDIUM

(75) Inventors: Yasuo Furukawa, Tokyo (JP); Gorschwin Fey, Tokyo (JP); Satoshi Komatsu, Tokyo (JP); Masahiro Fujita, Tokyo (JP)

(73) Assignees: Advantest Corporation, Tokyo (JP); The University Of Tokyo, Tokyo (JP)

( * ) Notice: Subject to any disclaimer, the term of this patent is extended or adjusted under 35 U.S.C. 154(b) by 328 days.

This patent is subject to a terminal disclaimer.

(21) Appl. No.: 12/201,267

(22) Filed: Aug. 29, 2008

(65) Prior Publication Data

US 2010/0058131 A1 Mar. 4, 2010

(51) Int. Cl.
*G11C 29/00* (2006.01)
*G11C 7/00* (2006.01)
*G01R 31/28* (2006.01)
*G06F 11/00* (2006.01)
*G06F 17/50* (2006.01)

(52) U.S. Cl. .......... 714/738; 714/741; 714/724; 703/15; 703/14; 365/201

(58) Field of Classification Search .................. None
See application file for complete search history.

(56) References Cited

U.S. PATENT DOCUMENTS

| | | | | |
|---|---|---|---|---|
| 4,862,399 A * | 8/1989 | Freeman | .................. | 714/738 |
| 5,592,493 A * | 1/1997 | Crouch et al. | ................. | 714/729 |
| 5,670,892 A * | 9/1997 | Sporck | ..................... | 324/765 |
| 6,205,559 B1 * | 3/2001 | Sakaguchi | ..................... | 714/25 |
| 6,975,978 B1 * | 12/2005 | Ishida et al. | .................... | 703/15 |
| 7,225,378 B2 * | 5/2007 | Ishida et al. | .................... | 714/741 |
| 7,254,764 B2 * | 8/2007 | Ishida et al. | .................... | 714/738 |
| 7,359,822 B2 * | 4/2008 | Fujiwara et al. | ............. | 702/120 |
| 7,454,679 B2 * | 11/2008 | Kumaki | ........................ | 714/738 |
| 7,461,314 B2 * | 12/2008 | Chiba et al. | .................. | 714/738 |
| 7,631,234 B2 * | 12/2009 | Yamada | ........................ | 714/724 |
| 2004/0025123 A1 * | 2/2004 | Angilivelil | ........................ | 716/4 |
| 2004/0163023 A1 * | 8/2004 | Ishida et al. | .................. | 714/738 |
| 2005/0278599 A1 * | 12/2005 | Fujiwara et al. | ............. | 714/742 |
| 2006/0248390 A1 * | 11/2006 | Hori et al. | ........................ | 714/28 |

OTHER PUBLICATIONS

Article Titled "IDDX-Based Test Methods: A Survey" jointly authored by Sagar S. Sabade et al. in ACM Transactions on Design Automation of Electronic Systems, Apr. 2004, vol. 9, No. 2 (pp. 159-198).

* cited by examiner

*Primary Examiner* — Jeffrey A Gaffin
*Assistant Examiner* — Guerrier Merant
(74) *Attorney, Agent, or Firm* — J.C. Patents

(57) ABSTRACT

Provided is a test apparatus that tests a device under test, including a vector expanding section that sequentially generates a plurality of test vectors; a vector selecting section that selects test vectors that cause a prescribed characteristic of the device under test, which is to be measured when test signals that are each based on one of the test vectors are supplied to the device under test, to fulfill a preset condition; and a judging section that judges pass/fail of the device under test based on measured values of the prescribed characteristic of the device under test supplied with the test signal based on the test vectors selected by the vector selecting section.

20 Claims, 11 Drawing Sheets

312

| state | AND | OR |
|---|---|---|
| 00 | 8pA | 16pA |
| 01 | 11pA | 13pA |
| 10 | 13pA | 11pA |
| 11 | 16pA | 9pA |

TEST APPARATUS, TEST VECTOR GENERATE UNIT, TEST METHOD, PROGRAM, AND RECORDING MEDIUM

BACKGROUND

1. Technical Field

The present invention relates to a test apparatus, a test vector generating unit, a test method, a program, and a recording medium. In particular, the present invention relates to a test apparatus that tests a device under test such as a semiconductor circuit.

2. Related Art

A conventional method for testing a device under test such as a semiconductor circuit involves measuring a characteristic of the device under test while a logic circuit of the device under test operates according to a prescribed logic pattern. If the device under test includes a CMOS circuit, the device under test is tested by measuring the quiescent current IDDQ or the transient current IDDT flowing to the device under test while changing the logic pattern applied to the CMOS circuit, as in, for example, "IDDX-Based Test Methods: A Survey", SAGAR S. SABADE and DUNCAN M. WALKER, ACM Transactions on Design Automation of Electronic Systems, Vol. 9, No. 2, April 2004, Pages 159-198.

Since one of a pair of transistors in the gate is turned off, the current flowing from the H power supply line to the L power supply line via the CMOS circuit is extremely small. If these transistors are defective, a relatively large leak current might flow through the CMOS circuit depending on the logic state of the CMOS circuit.

This leak current can be detected by observing the quiescent current IDDQ flowing to the device under test. The defective portion of the device under test can be estimated by analyzing test vectors applied to the device under test while a relatively large leak current flows to the device under test.

A certain fluctuation of IDDQ is expected. But if the fluctuation of the IDDQ current exceeds a prescribed value, the device is considered defective.

Since measuring the quiescent current IDDQ involves detecting the current corresponding to the leak current of the CMOS circuit, it is necessary to measure the current with a high degree of accuracy. However, the quiescent current IDDQ flowing to the device under test might change depending on the test vectors.

FIG. 12A shows an exemplary circuit in a device under test 312. The device under test 312 uses CMOS circuits for each of a 2-input AND gate 302, a 2-input OR gate 304, and a 2-input OR gate 306 included therein. The AND gate 302 outputs an AND of an input bit i2 and an input bit i3. The OR gate 304 outputs an OR of the input bit i1 and an output bit of the AND gate 302. The OR gate 306 outputs an OR of an input bit i3 and an input bit i4.

FIG. 12B is a table showing the leak current in the non-defective AND gate 302, OR gate 304, and OR gate 306, for each input logic state. For example, when the device under test 312 is supplied with the input bits {i1, i2, i3, i4}={0, 1, 1, 0}, the leak current of the AND gate 302 is 16 pA, the leak current of the OR gate 304 is 13 pA, and the leak current of the OR gate 306 is 11 pA. Therefore, the leak current of the device under test 312 is 16 pA+13 pA+11 pA=40 pA.

On the other hand, when the device under test 312 is supplied with the input bits {i1, i2, i3, i4}={1, 0, 0, 1}, the leak current of the AND gate 302 is 8 pA, the leak current of the OR gate 304 is 11 pA, and the leak current of the OR gate 306 is 13 pA. Therefore, the leak current of the device under test 312 is 8 pA+11 pA+13 pA=32 pA.

In this way, the leak current in the device under test 312 changes according to the pattern of the input bits. When the leak current changes depending on the input pattern, it becomes difficult to accurately detect the fluctuation of the leak current caused by a defect. Therefore, pass/fail of the device under test 312 cannot be accurately judged.

SUMMARY

Therefore, it is an object of an aspect of the innovations herein to provide a test apparatus, a test vector generating unit, a test method, a program, and a recording medium, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary test apparatus may include a test apparatus that tests a device under test, including a vector expanding section that sequentially generates a plurality of test vectors; a vector selecting section that selects test vectors that cause a prescribed characteristic of the device under test, which is to be measured when test signals that are each based on one of the test vectors are supplied to the device under test, to fulfill a preset condition; and a judging section that judges pass/fail of the device under test based on measured values of the prescribed characteristic of the device under test supplied with the test signal based on the test vectors selected by the vector selecting section.

According to a second aspect related to the innovations herein, one exemplary test vector generating unit may include a test vector generating unit that generates a plurality of test vectors for a test apparatus that judges pass/fail of a device under test by measuring a prescribed characteristic of the device under test supplied with test signals that each correspond to a test vector, the test vector generating unit including a vector expanding section that sequentially generates the plurality of test vectors; and a vector selecting section that selects test vectors for testing the device under test that cause the prescribed characteristic of the device under test, which is to be measured when test signals corresponding to the test vectors are supplied to the device under test, to fulfill a preset condition.

According to a third aspect related to the innovations herein, one exemplary test method may include a method for testing a device under test, including the steps of sequentially generating a plurality of test vectors; selecting test vectors that cause a prescribed characteristic of the device under test, which is to be measured when test signals that are each based on one of the test vectors are supplied to the device under test, to fulfill a preset condition; supplying the device under test with test signals based on the selected test vectors; and judging pass/fail of the device under test based on measured values of the prescribed characteristic of the device under test supplied with the test signals.

According to a fourth aspect related to the innovations herein, one exemplary program may include a program that causes a test vector generating unit to: generate a plurality of test vectors for a test apparatus that judges pass/fail of a device under test by measuring a prescribed characteristic of the device under test supplied with test signals that each correspond to a test vector; function as a vector expanding section that sequentially generates the plurality of test vectors; and function as a vector selecting section that selects test vectors for testing the device under test that cause the pre-scribed characteristic of the device under test, which is to be measured when test signals corresponding to the test vectors are supplied to the device under test, to fulfill a preset condition. The program may be stored on a recording medium.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
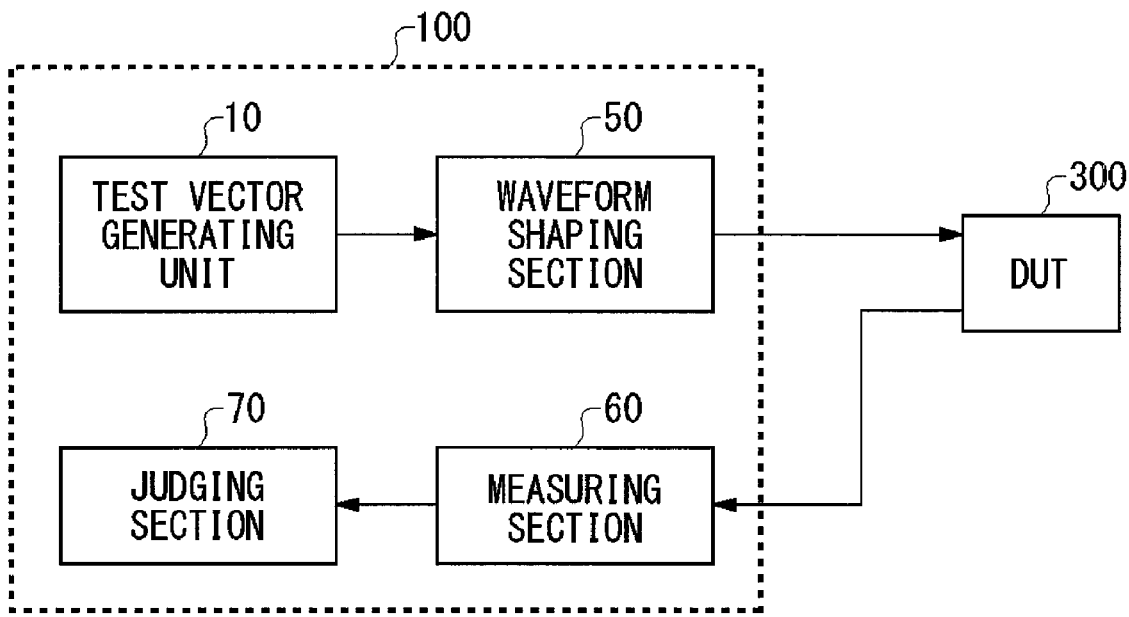
FIG. 1 shows an exemplary configuration of a test apparatus 100 according to an embodiment of the present invention.

FIG. 1 shows an exemplary configuration of a test apparatus 100 according to an embodiment of the present invention. The test apparatus 100 tests a device under test 300 such as a semiconductor circuit, and is provided with a test vector generating unit 10, a waveform shaping section 50, a measuring section 60, and a judging section 70.

The test apparatus 100 supplies the device under test 300 with a test signal having a prescribed pattern to test the device under test 300. For example, the test apparatus 100 judges pass/fail of the device under test 300 by measuring a prescribed characteristic of the device under test 300 supplied with the test signal. The test apparatus 100 may generate a test signal that causes a circuit block in the device under test 300 to operate.

The test apparatus 100 may measure the quiescent current IDDQ of the device under test 300 when the device under test 300 is inactive after being supplied with the test signal. In this case, the device under test 300 may be a semiconductor circuit that includes a plurality of CMOS circuits operating in accordance with the supplied test signal.

The test apparatus 100 can measure the quiescent current IDDQ for each state of the circuit block in the device under test 300 by sequentially supplying the device under test 300 with test signals having different logic patterns. The test apparatus 100 may analyze the defective portion of the device under test 300 based on the logic pattern of the test signal being supplied when the quiescent current IDDQ has an abnormal value.

The characteristic of the device under test 300 measured by the test apparatus 100 is not limited to the quiescent current IDDQ. The test apparatus 100 may measure any characteristic of the device under test 300 having a value that changes in accordance with the logic pattern of the test signal. This characteristic of the device under test 300 may be a voltage value, a current value, a voltage waveform, a current waveform, noise, or the like of power or of a signal input to or output from the device under test 300. The test apparatus 100 may measure the characteristic of an internal element of the device under test 300. For example, the test apparatus 100 measures the characteristic of a threshold voltage or the like of a transistor in the device under test 300.

The test vector generating unit 10 sequentially generates test vectors indicating a desired logic pattern of each test signal. For example, the test vector generating unit 10 generates test vectors having a plurality of bits corresponding to a plurality of pins under test of the device under test 300.

The waveform shaping section 50 sequentially generates test signals corresponding to the test vectors generated by the test vector generating unit 10. For example, the waveform shaping section 50 generates test signals having waveforms corresponding to the logic patterns of the test vectors. The waveform shaping section 50 may supply each pin under test of the device under test 300 with a signal according to the corresponding bit value of the test vector.

The measuring section 60 measures the prescribed characteristic of the device under test 300 being supplied with the test signals. For example, the measuring section 60 sequentially measures the quiescent current IDDQ of the device under test 300 during the supply of each test signal.

The judging section 70 judges pass/fail of the device under test 300 based on the values measured by the measuring section 60. For example, the judging section 70 measures pass/fail of the device under test 300 based on the variance of the values measured by the measuring section 60.

The judging section 70 may judge whether each value of the quiescent current IDDQ measured by the measuring section 60 is within a prescribed selection range. If one of the values of the quiescent current IDDQ is outside of the prescribed selection range, the judging section 70 may analyze the defective portion of the device under test 300 based on the test vector corresponding to the aforementioned value.

If different test signals are supplied to the device under test 300 in succession, the judging section 70 may judge whether the fluctuation amount of the quiescent current IDDQ measured by the measuring section 60 is within the prescribed selection range. If this fluctuation amount is outside of the prescribed selection range, the judging section 70 may analyze the defective portion of the device under test 300 by comparing the test vectors before and after the fluctuation of the quiescent current IDDQ.

The device under test 300 can be tested using the configuration described above. If the value of the characteristic measured by the measuring section 60 fluctuates according to the logic pattern of the test vector and is unrelated to the pass/fail of an internal circuit of the device under test 300, it might be impossible to determine whether the fluctuation of the measured value is caused by a defect in the device under test 300 or caused by the logic patterns of the test vectors. To solve this problem, the test vector generating unit 10 decreases the fluctuation of the IDDQ in relation to the logic patterns of the test vectors by generating test vectors that cause the expected measurement value of the IDDQ to be within a constant range. This enables accurate measurement of the fluctuation of the IDDQ caused by a defect in the device under test 300.

Figure 2:
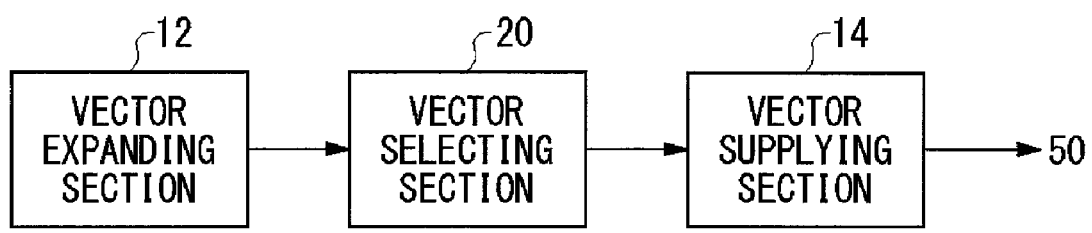
FIG. 2 shows an exemplary configuration of the test vector generating unit 10.

FIG. 2 shows an exemplary configuration of the test vector generating unit 10. The test vector generating unit 10 is provided with a vector expanding section 12, a vector selecting section 20, and a vector supplying section 14.

The vector expanding section 12 sequentially generates the test vectors having different logic patterns. For example, the vector expanding section 12 sequentially generates the test vectors according to an algorithm supplied in advance.

When the test signals corresponding to the test vectors are supplied to the device under test 300, the vector selecting section 20 selects the test vectors through which the measured value obtained by the measuring section 60 fulfills a predetermined condition. For example, the vector selecting section 20 is supplied with the logic pattern of each test vector and information concerning the circuits in the device under test 300. The vector selecting section 20 may calculate a predicted value to be expected when measuring is performed by the measuring section 60 for each test vector, by simulating the performance of the device under test 300 supplied with the test signal corresponding to each test vector, based on the provided logic patterns and circuit information.

The vector selecting section 20 calculates this predicted value for each test vector generated by the vector expanding section 12. The vector selecting section 20 may select the test vectors in which the corresponding predicted values are within a prescribed selection range.

The vector supplying section 14 supplies the waveform shaping section 50 with the test vectors selected by the vector selecting section 20. With this configuration, the variance of the values measured by the measuring section 60, which is caused by the logic patterns of the test vectors, can be contained within a prescribed selection range. Therefore, the variance of the values measured by the measuring section 60, which is caused by a defect in the device under test 300, can be accurately measured to accurately identify a defective device under test 300.

Figure 3A:
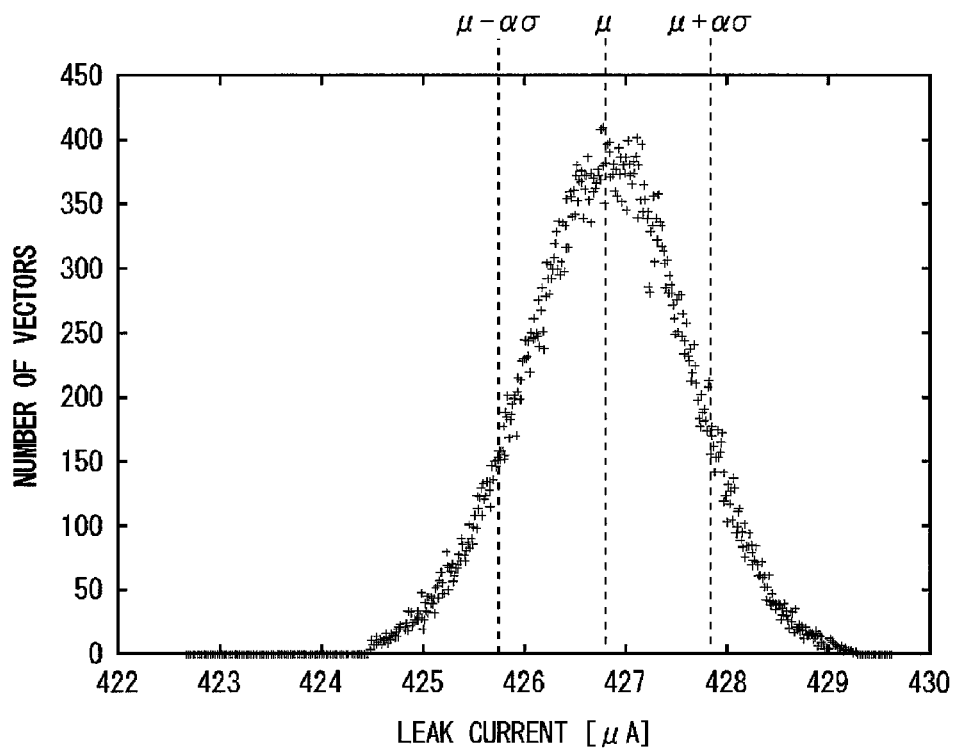
FIG. 3A is an exemplary histogram showing occurrence rate of the predicted values to be measured by the measuring section 60 when a plurality of test vectors are used.

FIG. 3A is an exemplary histogram showing an occurrence rate of the predicted values when a plurality of test vectors are used. In FIG. 3A, the horizontal axis represents predicted values of the quiescent current, which corresponds to the leak current in the plurality of CMOS circuits, and the vertical axis represents the occurrence rate of the test vectors obtained with the measured values. In the example of FIG. 3A, a simulation was used to find the leak currents obtained when a prescribed number of randomly generated test vectors were supplied to an ITC'99 benchmark circuit b18.

In most circuits, when the leak current is measured using a set of test vectors having random logic patterns, the distribution of the predicted values is shaped as a normal distribution, as shown in FIG. 3A. The vector selecting section 20 may designate the selection range of predicted values used to select the test vectors, based on the histogram.

For example, the vector selecting section 20 designates the selection range of predicted values based on the predicted value having the highest occurrence rate. The vector selecting section 20 may instead designate the selection range of predicted values based on the average value in the histogram. For example, the vector selecting section 20 sets the average value or the value of the highest occurrence rate in the histogram to be a central value $\mu$ of the selection range.

The vector selecting section 20 may instead designate the selection range of the predicted values based on the standard deviation $\sigma$ in the histogram. For example, the vector selecting section 20 sets the upper limit and the lower limit of the selection range to be values calculated by adding or subtracting a value, which is obtained by multiplying the standard deviation $\sigma$ by a predetermined coefficient $\alpha$, to or from the central value $\mu$. In other words, the vector selecting section 20 may set the selection range of the predicted values to be between $\mu - \alpha\sigma$ and $\mu + \alpha\sigma$.

In this way, the central value of the selection range of the predicted values is set to be the average value or the value of the highest occurrence rate in the histogram, so as to prevent a decrease in the coverage of the test for the device under test 300. In other words, setting the peak portions of the histogram as centers of the selection ranges allows the selection ranges to include a larger set of test vectors. Therefore, the vector selecting section 20 can select test vectors included in the selection ranges, from among the large set of test vectors, to prevent a decrease in the testing coverage.

The histogram may be supplied to the vector selecting section 20 by a user or the like. The test apparatus 100 may calculate the histogram by simulating the operation of the device under test 300 in advance. The test apparatus 100 may generate the histogram by actually measuring the device under test 300. In this case, the test apparatus 100 may include a vector generating section that sequentially generates a plurality of test vectors having random logic patterns.

Figure 3B:
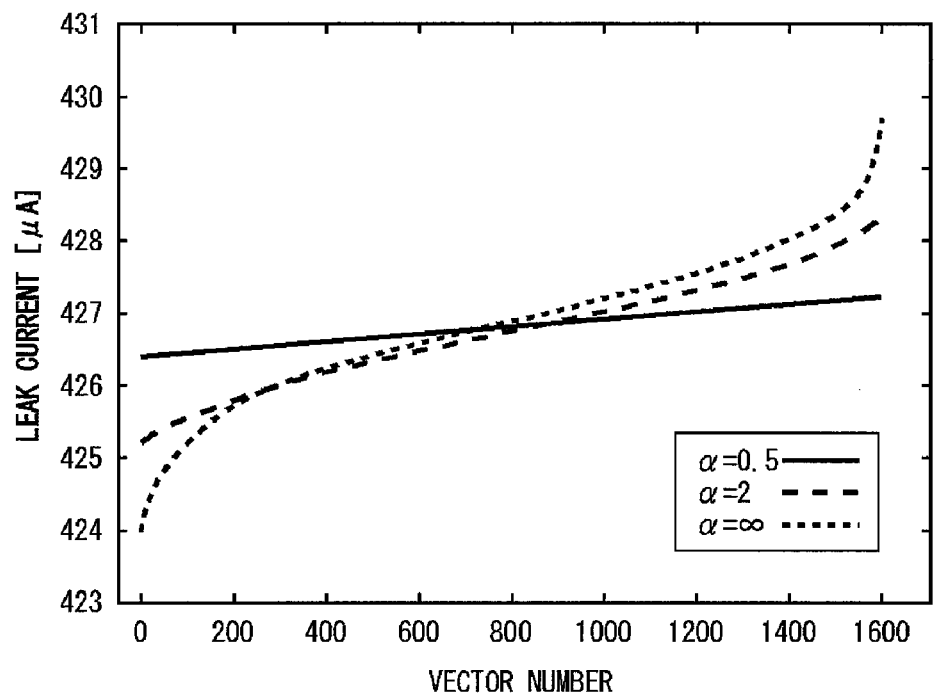
FIG. 3B shows the leak current corresponding to the plurality of test vectors, measured for different coefficients α.

FIG. 3B shows the leak current corresponding to the plurality of test vectors, measured for different coefficients $\alpha$. In FIG. 3B, the horizontal axis represents the number given to each test vector. The number of each test vector is determined for each coefficient $\alpha$, such that test vectors having the same number are different for different values of the coefficient $\alpha$. In FIG. 3B, the vertical axis represents the value of the leak current.

As described above, the width of the selection range of the predicted values is determined by the coefficient $\alpha$. In the present embodiment, the smaller the value of the coefficient $\alpha$, the narrower the selection range of the predicted values, which also causes a narrower distribution range of the leak current caused by the test vectors. If the coefficient $\alpha$ is equal to 0.5, for example, the fluctuation of the leak current caused by the test vectors can be narrowed to approximately 1 $\mu$a. Therefore, the fluctuation of the leak current caused by the defect in the device under test 300 can be more accurately detected. The vector selecting section 20 may set the coefficient $\alpha$ such that the fluctuation of the leak current caused by the test vectors is sufficiently smaller than the fluctuation of the leak current caused by the defect in the device under test 300.

However, since decreasing the value of the coefficient $\alpha$ decreases the coverage of the test, the defective circuit block being tested for might not be detected if the test vectors are selected according to the selection range. The vector selecting section 20 may be provided in advance with test vectors for testing a certain minimal number of circuit blocks, and may set the selection range of the predicted values to include the predicted values corresponding to these test vectors.

Figure 4:
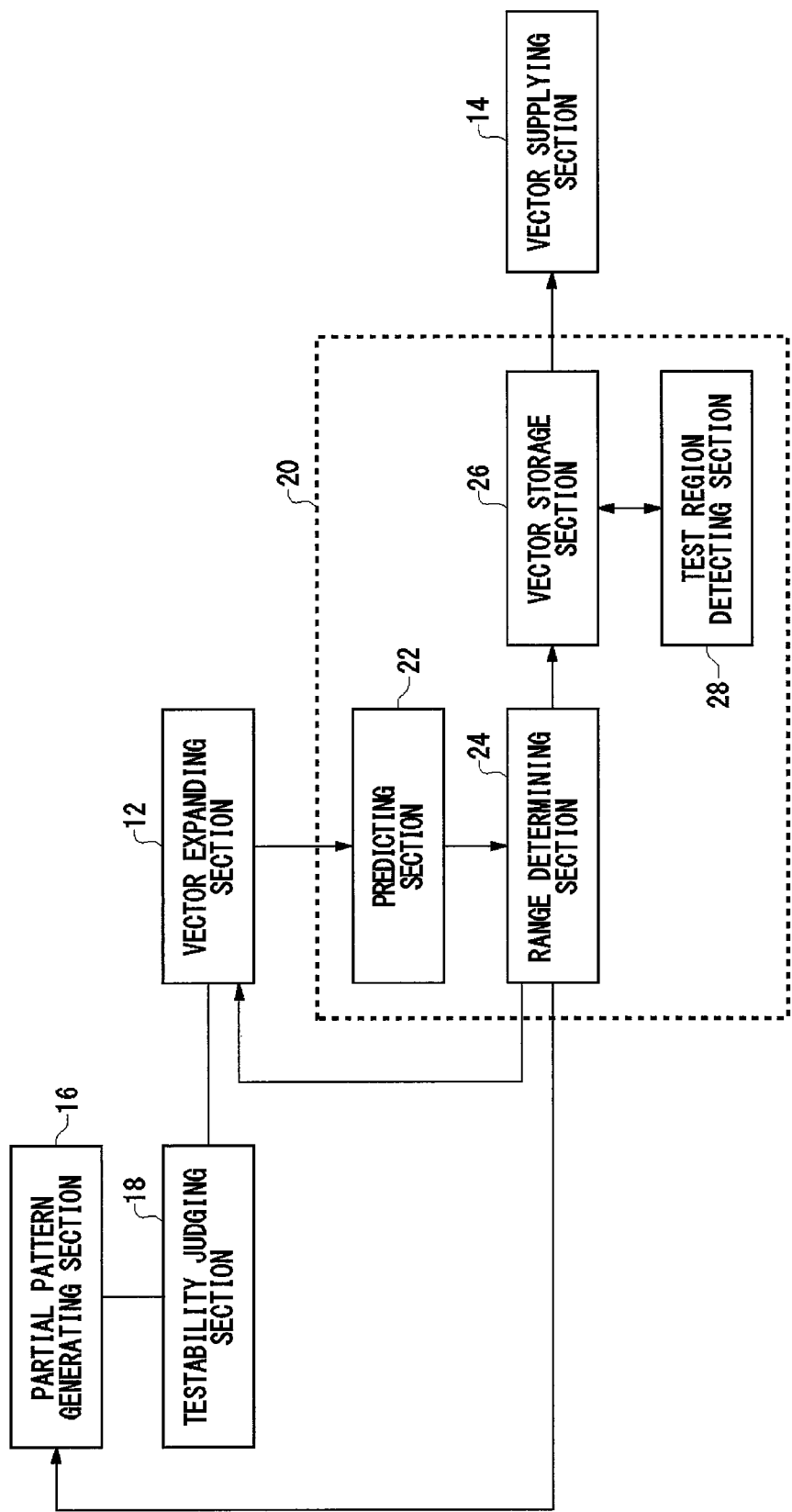
FIG. 4 shows another exemplary configuration of the test vector generating unit 10.

FIG. 4 shows another exemplary configuration of the test vector generating unit 10. The test vector generating unit 10 of the present embodiment includes a partial pattern generating section 16 and a testability judging section 18 in addition to the configuration of the test vector generating unit 10 described in relation to FIG. 2. The vector selecting section 20 includes a predicting section 22, a range determining section 24, a vector storage section 26, and a test region detecting section 28.

The partial pattern generating section 16 generates a partial pattern that specifies the logic values of the bits corresponding to the circuit block in the test vectors. The partial pattern causes a predetermined circuit block in the device under test 300 to operate. For example, in order to test a first circuit block that operates according to a range of bits in the test vector from an a-th bit to an (a+n)-th bit, the partial pattern generating section 16 generates a partial pattern that specifies the bits in the test vector from the a-th bit to the (a+n)-th bit.

The partial pattern generating section 16 may sequentially generate partial patterns for all of the circuit blocks to be tested. The testability judging section 18 determines whether pass/fail of these circuit blocks can be judged using the partial patterns generated by the partial pattern generating section 16. For example, if test vectors including these partial patterns are supplied to the device under test 300, the testability judging section 18 may run a simulation or the like to check whether the device under test 300 can perform the prescribed process. The testability judging section 18 supplies the vector expanding section 12 with the partial patterns that are determined to be able to test the target circuit blocks.

The vector expanding section 12 sequentially generates test vectors that include the partial patterns generated by the partial pattern generating section 16 but have overall patterns that are different from each other. For example, for a single partial pattern, the vector expanding section 12 sequentially generates a plurality of test vectors in which the logic values of each bit that is not specified by the partial pattern is sequentially changed.

The vector selecting section 20 selects test vectors that fulfill a prescribed condition, from among the plurality of test vectors generated by the vector expanding section 12. As described above, the vector selecting section 20 may select these test vectors based on whether the leak current calculated for each test vector is within the prescribed selection range. The operation of the vector selecting section 20 is described in detail hereinafter. The vector supplying section 14 supplies the waveform shaping section 50 with the test vectors selected by the vector selecting section 20.

Figure 5:
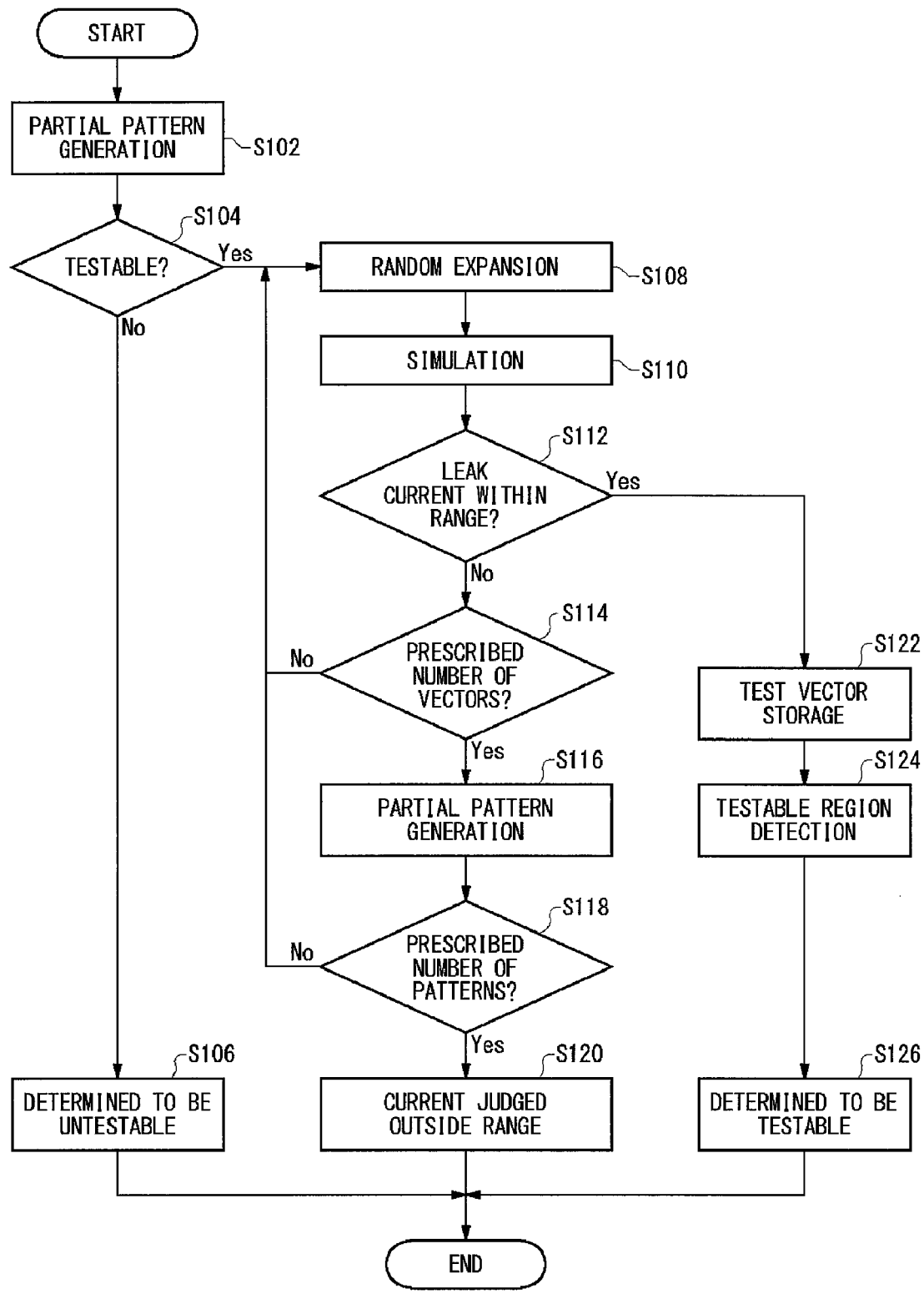
FIG. 5 is a flow chart showing an exemplary operation of the test vector generating unit 10 shown in FIG. 4.

FIG. 5 is a flow chart showing an exemplary operation of the test vector generating unit 10 shown in FIG. 4. This example describes the operation of the test vector generating unit 10 when generating test vectors for testing one circuit block. The test vector generating unit 10 may perform the process described by this example for each of the circuit blocks to be tested.

First, the partial pattern generating section 16 generates the partial pattern (S102). The testability judging section 18 determines whether the partial pattern can test the prescribed circuit block (S104).

The process of S104 may be performed when the partial pattern generating section 16 generates the partial pattern. If the testability judging section 18 determines at S102 and S104 that partial patterns that can test the circuit block are not present, the test vector generating unit 10 judges that the circuit block cannot be tested (S106), and the process is then finished. At this time, the pattern generating section 16 begins generating partial patterns for the next circuit block.

If the testability judging section 18 determines that the partial pattern can test the prescribed circuit block at S104, the vector expanding section 12 sequentially generates test vectors that include the partial pattern but have overall patterns that are different from each other (S108). For example, the vector expanding section 12 generates test vectors in which the logic values of the bits that are not specified by the partial pattern are randomly determined.

Figures 12A, 12B:
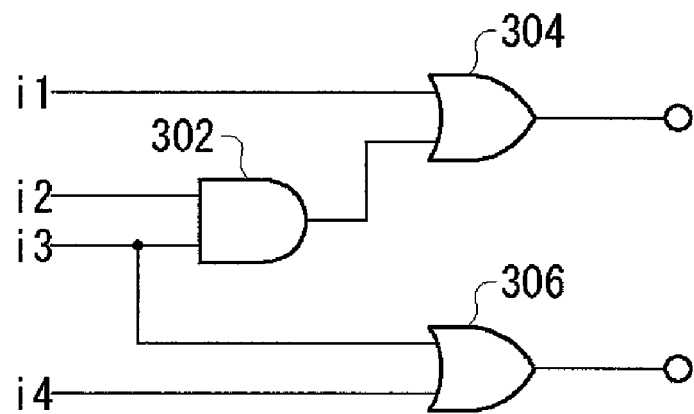
FIG. 12A shows an exemplary circuit in a device under test 312.
FIG. 12B is a table showing the leak current in non-defective AND gate 302, OR gate 304, and OR gate 306, for each input logic state.

The predicting section 22 uses the test vectors sequentially generated by the vector expanding section 12 to simulate the operation of the device under test 300, so as to calculate the predicted values of the leak current for each of the test vectors (S110). The predicting section 22 may be supplied in advance with the circuit information of the device under test 300. For example, the predicting section 22 may be supplied in advance with circuit information that associates the operational state with the leak current for each circuit element of the device under test 300, as shown in FIG. 12B.

The range determining section 24 judges whether the predicted values calculated by the predicting section are within the predetermined selection range (S112). If the range determining section 24 determines that the predicted values are not within the predetermined selection range at S112, the range determining section 24 judges whether the number of test vectors generated by the vector expanding section 12 using the partial pattern has reached the prescribed number (S114).

If the range determining section 24 determines that the number of generated test vectors has not reached the prescribed number at S114, the range determining section 24 notifies the vector expanding section 12 that the prescribed number has not been reached, to cause the subsequent test vector to be generated (S108). In this case, the test vector generating unit 10 repeats the processes from S110.

If the range determining section 24 determines that the number of generated test vectors has reached the prescribed number at S114, the range determining section 24 notifies the partial pattern generating section 16 that none of the predicted values corresponding to the test vectors expanded from the partial pattern by the vector expanding section 12 are within the predetermined selection range. Upon receiving this notification, the partial pattern generating section 16 generates another different partial pattern for the circuit block (S116).

More specifically, the vector expanding section 12 sequentially generates, for each partial pattern, the different test vectors containing the same partial pattern until a test vector corresponding to a predicted value in the selection range is extracted (S112) or until the number of test vectors generated based on the partial pattern reaches a prescribed amount (S114). A multitude of test vectors can be generated from a single partial pattern. However, calculating the predicted values for all of the test vectors causes a drop in efficiency since identical predicted values are obtained for test vectors having data patterns that differ only slightly from each other.

To avoid this problem, the present embodiment can sequentially generate a variety of types of test vectors by generating test vectors in which bits not designated by the partial pattern are randomly determined. When the number of test vectors generated based on one partial pattern reaches a prescribed amount, a judgment is made that the chance of generating a test vector that fulfills the prescribed condition based on the test pattern is low. In this case, the vector expanding section 12 expands the test vectors using the next partial pattern that can test the circuit block. Therefore, the test vector fulfilling the prescribed condition can be extracted more efficiently than by calculating the predicted values for all of the test vectors.

When generating the subsequent partial pattern, a judgment may be made as to whether the number of partial patterns generated for the circuit block by the partial pattern generating section 16 has reached a prescribed amount (S118). If the judgment is made at S118 that the number of partial patterns generated by the partial pattern generating section 16 has reached the prescribed amount, the range determining section 24 determines that a test vector exists that can test the circuit block, but that a test vector corresponding to a predicted value of the leak current that fulfills the prescribed condition could not be found (S120). The process is then finished. At S118, even if the number of partial patterns has not reached the prescribed number, the process of S120 may be performed if it is judged that a subsequent partial pattern to be used does not exist.

If the judgment is made at S118 that the number of partial patterns has not reached the prescribed amount, the partial pattern generating section 16 supplies the vector expanding section 12 with a new partial pattern that can test the circuit block. More specifically, the partial pattern generating section 16 sequentially generates different partial test patterns for each circuit block until a test vector is extracted that has a predicted value within the selection range or until the number of generated partial patterns reaches the prescribed amount. The vector expanding section 12 repeats the processes from S108 for the next partial pattern supplied from the partial pattern generating section 16.

By using the process described above, the circuit block can be tested and a test vector is generated having a predicted value that fulfills the prescribed condition. The vector selecting section 20 may select one test vector for one circuit block, or may select a plurality of test vectors for one circuit block.

The vector selecting section 20 may select a combination of test vectors to be supplied to the device under test 300 in series. In this case, the predicting section 22 may calculate the predicted value of the leak current fluctuation when the combination of test vectors has been supplied to the device under test 300.

If the test vector corresponding to a predicted value of the leak current that is within the prescribed selection range is extracted at S112, the range determining section 24 stores this test vector in the vector storage section 26 (S122). The vector storage section 26 may store the test vector as a test vector that can test the target circuit block. For example, the vector storage section 26 stores the test vector in association with information identifying the target circuit block.

The test region detecting section 28 judges whether the test vector stored in the vector storage section 26 can be used to test circuit blocks other than the circuit block that can be tested by the corresponding partial pattern (S124). If other circuit blocks are detected as being testable by this test vector, the test region detecting section 28 may store this information in the vector storage section 26. For example, the test region detecting section 28 writes the information identifying other detected circuit blocks onto the vector storage section 26 in association with the test vector.

If the test vector is stored in the vector storage section 26, the vector selecting section 20 judges that the test vector fulfils the prescribed condition and can be used to test this circuit block (S126). The process is then finished. The test vector generating unit 10 may then begin the processes from S102 for the next circuit block. At this time, if the test region detecting section 28 detects that the subsequent circuit block is testable, the partial pattern generating section 16 may generate the partial pattern for the circuit block following the aforementioned circuit block.

Figure 6:
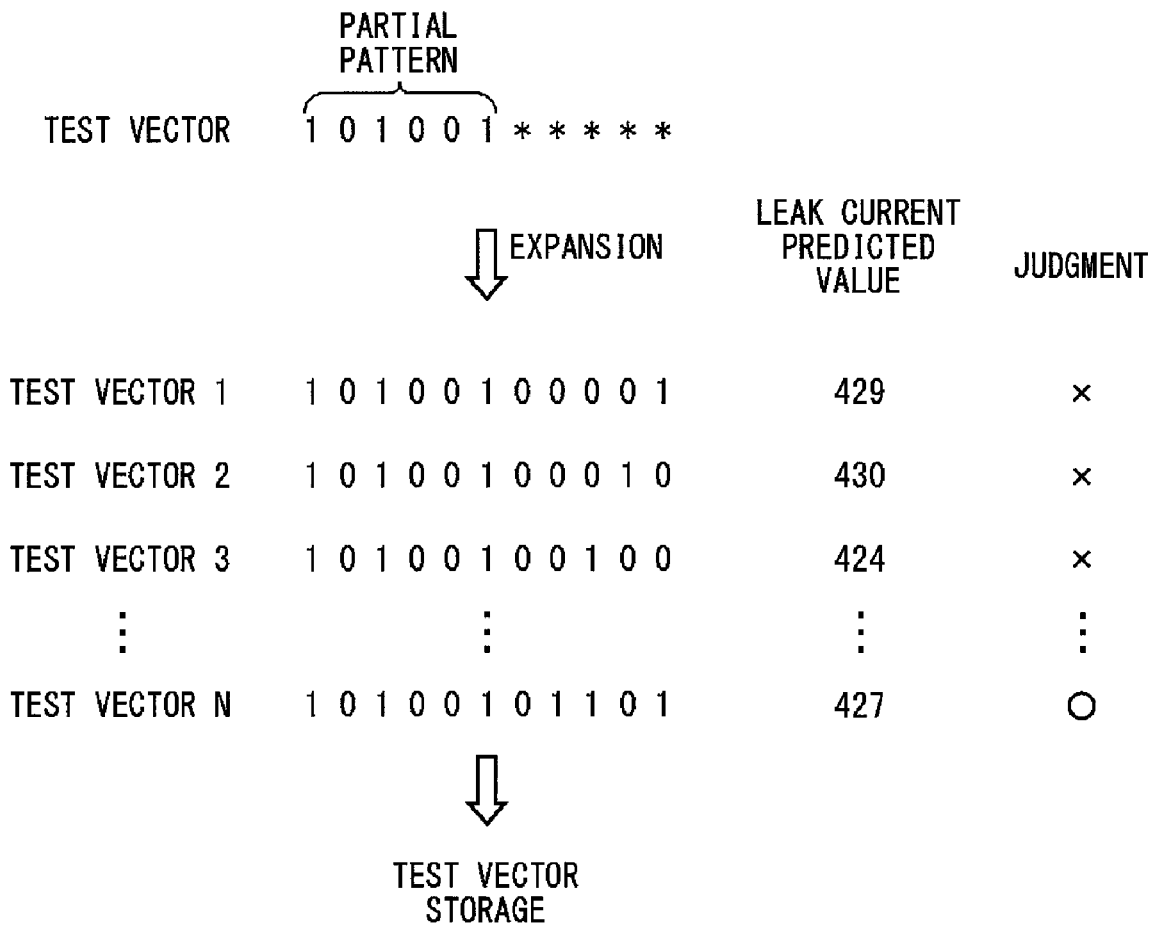
FIG. 6 describes a partial test pattern and test vectors.

FIG. 6 describes a partial test pattern and test vectors. The test vectors contain a plurality of bits corresponding to the plurality of pins under test of the device under test 300. Each circuit block of the device under test 300 operates according to the logic values of the corresponding bits in the test vectors.

When generating the test vector for testing a prescribed circuit block, the partial pattern generating section 16 generates a partial pattern that specifies logic values of the bits corresponding to the circuit block, from among the plurality of bits in the test vector. When testing the circuit block, other bits in the test vectors are set as arbitrary logic values.

The vector expanding section 12 sequentially expands test vectors that each include the partial pattern but have overall patterns that are different from each other. In other words, the vector expanding section 12 generates each test vector by specifying the logic values of the bits that are not specified by the partial pattern, from among the plurality of bits in the test vector.

The predicting section 22 calculates the predicted value of the leak current in the device under test 300 for each test vector generated by the vector expanding section 12. The range determining section 24 judges whether each predicted value calculated by the predicting section 22 fulfills the prescribed condition. The vector storage section 26 stores the test vectors judged by the range determining section 24 to have predicted values that fulfill the prescribed condition.

Figure 7:
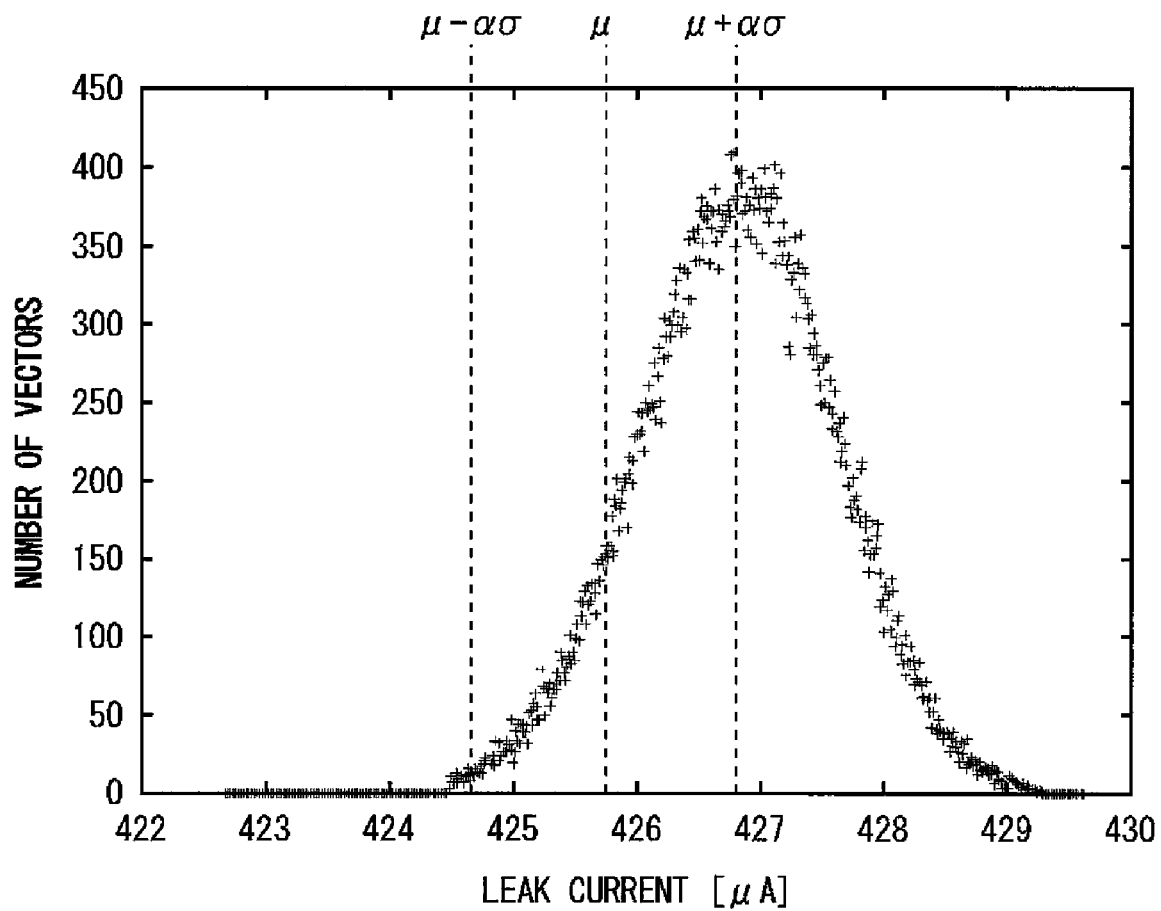
FIG. 7 describes an example of the selection range of the predicted values, used to select the test vectors.

FIG. 7 describes an example of the selection range of the predicted values. The vector selecting section 20 described in FIG. 3A designates a central value of the selection range based on the average value or the value of the highest occurrence rate in the histogram of the predicted values. The vector selecting section 20 in this example sets a value that is not in the peak portion of the histogram to be the central value $\mu$ of the selection range of the predicted values used to select the test vectors. The central value $\mu$ may be set by the user or the like.

The vector selecting section 20 need not set the selection range of the predicted values, which is used to select the test vectors, to include the peak value in the histogram of the predicted values. By designating the selection range of the predicted values as described above, the vector selecting section 20 can select test vectors to cover testing of the infrequent operations of the device under test 300.

Figure 8:
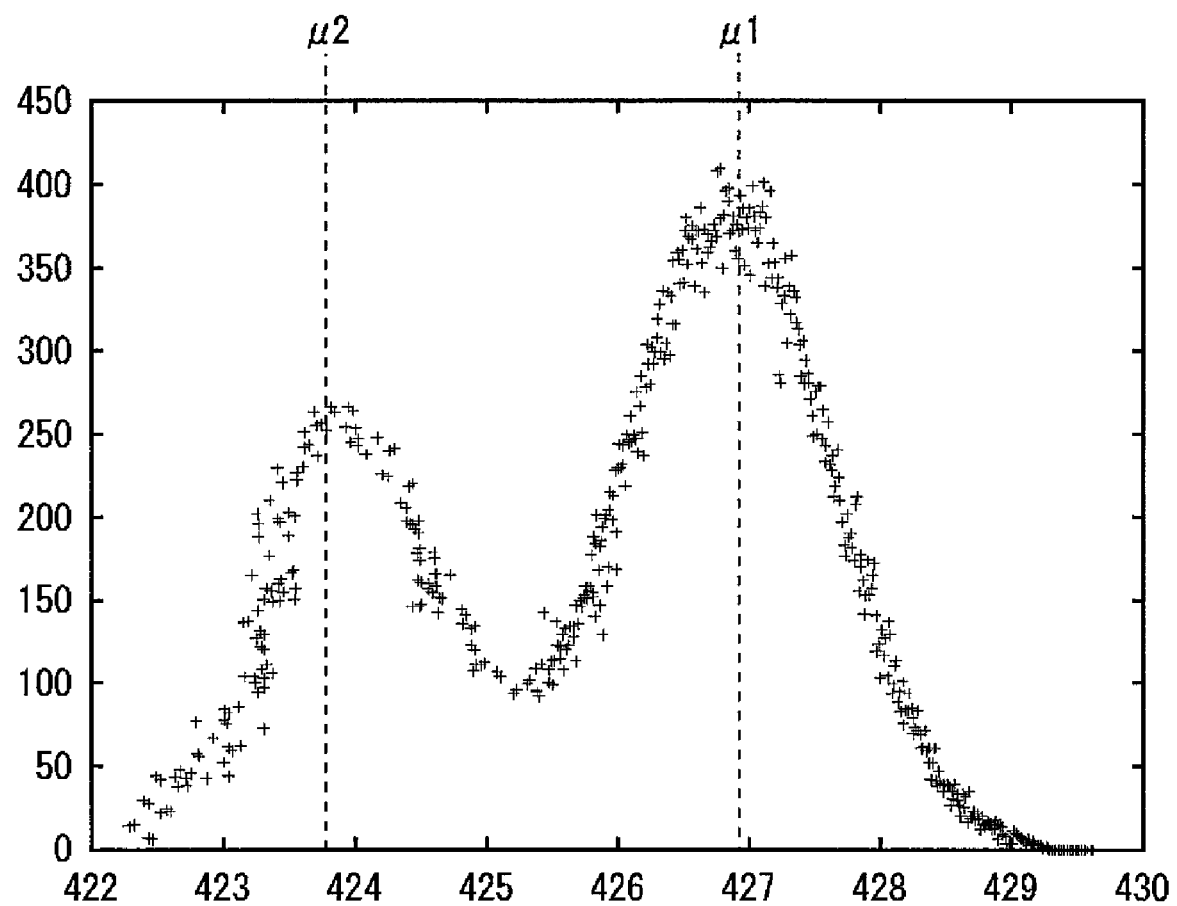
FIG. 8 describes another example of the selection range of the predicted values, used to select the test vectors.

FIG. 8 describes another example of the selection range of the predicted values. The vector selecting section 20 in this example uses a plurality of separate ranges as the selection range of the predicted values. For example, if the histogram of the predicted values has a plurality of peaks, the vector selecting section 20 may use a plurality of ranges with central values $\mu1$ and $\mu2$ corresponding to the plurality of peaks as the selection range of the predicted values.

Figure 9:
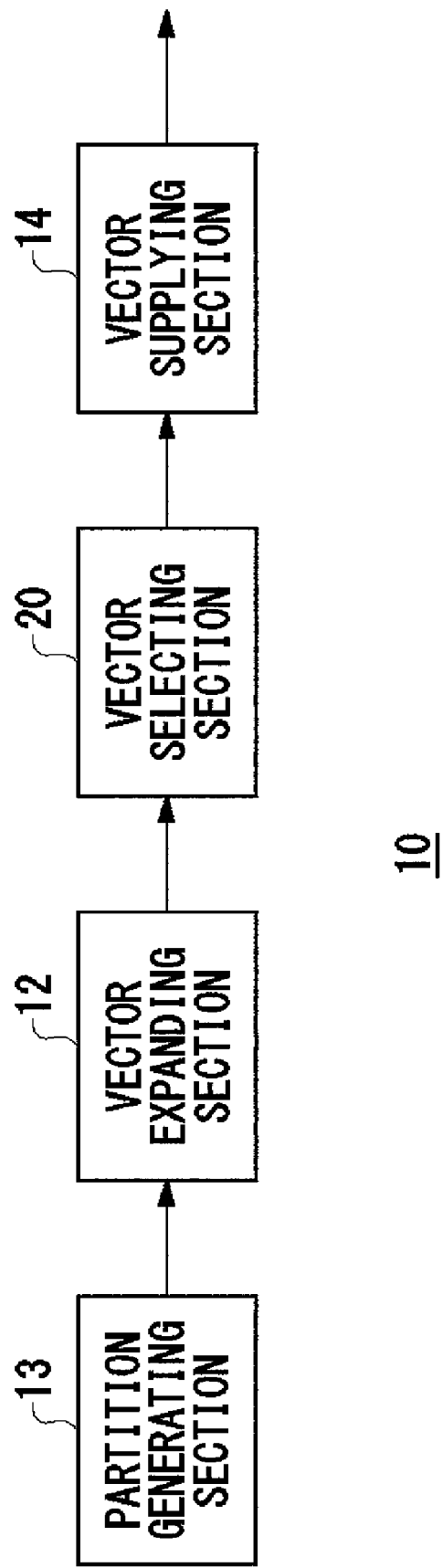
FIG. 9 shows another exemplary configuration of the test vector generating unit 10.

FIG. 9 shows another exemplary configuration of the test vector generating unit 10. The test vector generating unit 10 of the present embodiment is provided with a partition generating section 13 in addition to the configuration of the test vector generating unit 10 described in relation to FIG. 2. Elements other than the partition generating section 13 may have the same configuration and function as the elements described in FIGS. 2 to 8. The test vector generating unit 10 of the present embodiment partitions the device under test 300 into a plurality of circuit blocks, performs the processes described in relation to FIGS. 2 to 8 for each resulting circuit block, and judges pass/fail of each circuit block.

Generally, a variance occurs in the characteristic of the circuit elements due to processing variance or the like, even within the device under test 300. For example, a variance occurs in the characteristics of transistors formed in the device under test 300 when a variance occurs in the impurity concentration or the like in the substrate of the device under test 300.

Therefore, there is a possibility that the device under test 300 cannot be accurately tested due to the variances of the element characteristics in the device under test 300, even if the characteristic variance caused by the test vectors is suppressed as described in relation to FIGS. 1 to 8. The test vector generating unit 10 of the present embodiment partitions the device under test 300 into a plurality of circuit blocks and performs the processes described in relation to FIGS. 2 to 8 for each circuit block.

The variance for each circuit element in the measurement target increases when smaller feature sizes are considered. Since the test vector generating unit 10 of the present embodiment performs testing for each circuit block resulting from the partitioning of the device under test 300, the test vector generating unit 10 can decrease the effect of the characteristic variance of the circuit elements in order to accurately judge pass/fail of each circuit block.

The partition generating section 13 partitions the device under test 300 into a plurality of circuit blocks. For example, the partition generating section 13 extracts, as a circuit block, a region that can operate independently from other regions during testing of the device under test 300. Here, the region that can operate independently from other regions may be a region in which the logic states of the circuits can be arbitrarily changed even if the logic state of the circuits in other regions are fixed.

The partition generating section 13 may be provided in advance with connection information indicating the spacing between the circuit elements in the device under test 300. The partition generating section 13 may partition the device under test 300 into the plurality of circuit blocks by extracting independently operable regions based on the connection information.

The partition generating section 13 may be provided in advance with position information indicating the position of each circuit element in the device under test 300. The partition generating section 13 may partition the device under test 300 into the plurality of circuit blocks based on the position information. For example, the partition generating section 13 partitions the device under test 300 into a plurality of regions having identical areas, and extracts the circuit group included in each of these regions as one of the circuit blocks.

The vector expanding section 12 generates test vectors corresponding to each of these circuit blocks, and also generates test vectors corresponding to the other circuit blocks in which the logic patterns of the bits are fixed. In other words, the vector expanding section 12 generates a plurality of test vectors that sequentially change the logic state of the target circuit blocks, while keeping the logic states of the other circuit blocks fixed. The vector expanding section 12 of the present embodiment may fix the bits in the test vectors that do not correspond to the target circuit blocks to have predetermined logic values.

The vector selecting section 20 selects the test vectors generated by the vector expanding section 12. Since the vector expanding section 12 of the present embodiment expands test vectors for each circuit block, the vector selecting section 20 can select test vectors for each circuit block. The vector selecting section 20 may select the test vectors in the same manner as described in relation to FIG. 5. For example, the vector selecting section 20 selects the test vectors based on whether the predicted value resulting from the test vector fulfills the prescribed condition.

The vector supplying section 14 tests each circuit block based on the test vectors selected by the vector selecting section 20. The judging section 70 judges pass/fail of each circuit block based on the measured value of the prescribed characteristic measured for each circuit block. With this configuration, the test apparatus 100 can decrease the effect of the characteristic variance of the circuit elements to accurately judge pass/fail of the circuit blocks.

When measuring the IDDQ, the vector expanding section 12 may set each bit corresponding to other test vectors, in the test vectors corresponding to each target circuit block, to have a logic pattern that causes the current consumed by these other circuit blocks to be as small as possible. In this way, the test apparatus 100 can decrease the effect of other circuit blocks in order to accurately measure the quiescent current of the target circuit blocks. The vector expanding section 12 may perform a simulation to acquire the consumed current of the other circuit blocks when each test vector is used to operate these other circuit blocks.

Figure 10:
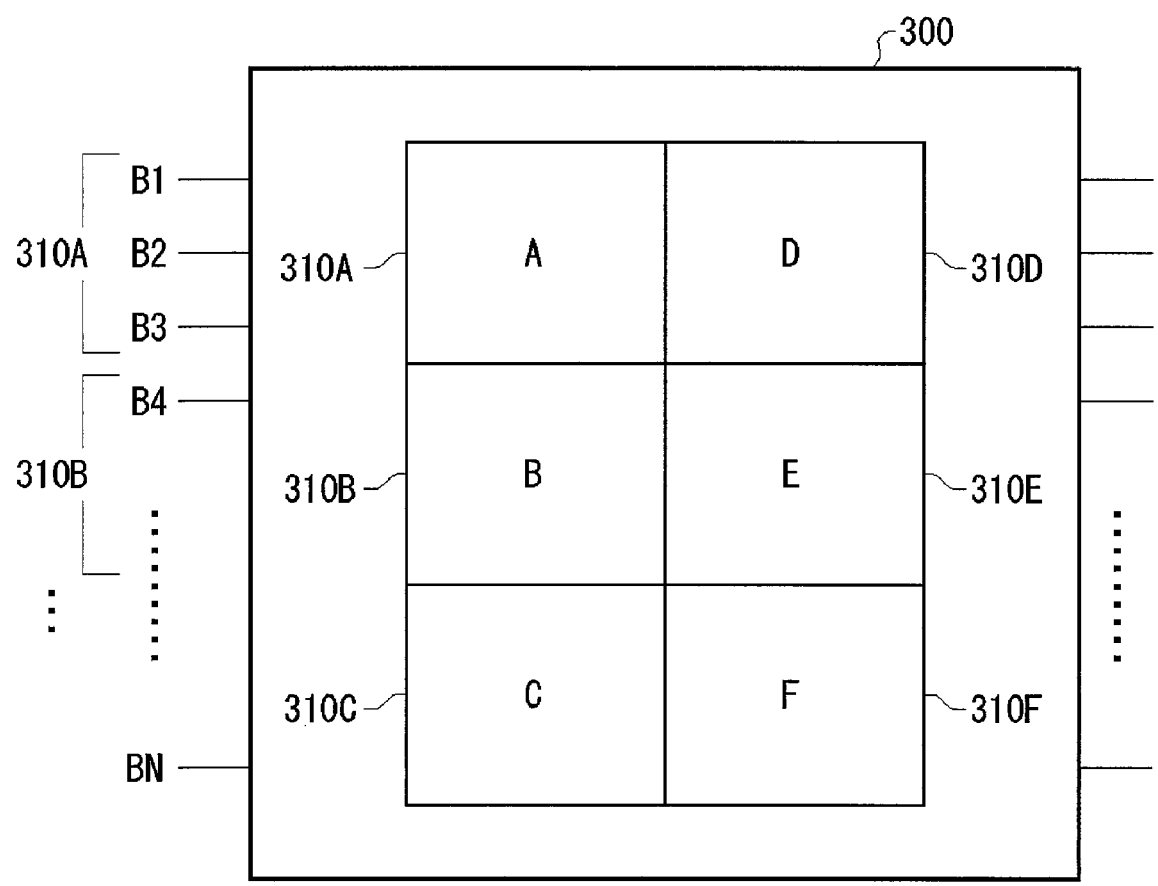
FIG. 10 shows an example of a plurality of circuit blocks 310.

FIG. 10 shows an example of a plurality of circuit blocks 310. The partition generating section 13 of the present embodiment partitions the device under test 300 into circuit blocks 310A to 310F. The vector expanding section 12 generates test vectors having N bits.

For example, if the bits B1 to B3 of a test vector correspond to the circuit block 310A, the vector expanding section 12 may generate the test vectors corresponding to the circuit block 310A by fixing the logic values of the bits B4 to BN and sequentially changing the logic values of the bits B1 to B3. The bits corresponding to the circuit blocks 310 may be the bits at which the logic state of the corresponding circuit block 310 transitions when the bit is changed.

In the same way, the vector expanding section 12 may sequentially generate the test vectors corresponding to the circuit block 310B by fixing the logic values of the bits other than the bits B4 to Bk corresponding to the circuit block 310B. By performing this process for each circuit block 310, a test vector group can be generated for each circuit block.

By selecting to use test vectors that fulfill the prescribed condition from among the vector group of each circuit block as described above, the component depending on the test pattern and the component depending on the characteristic variance of the circuit can be decreased.

Figure 11:
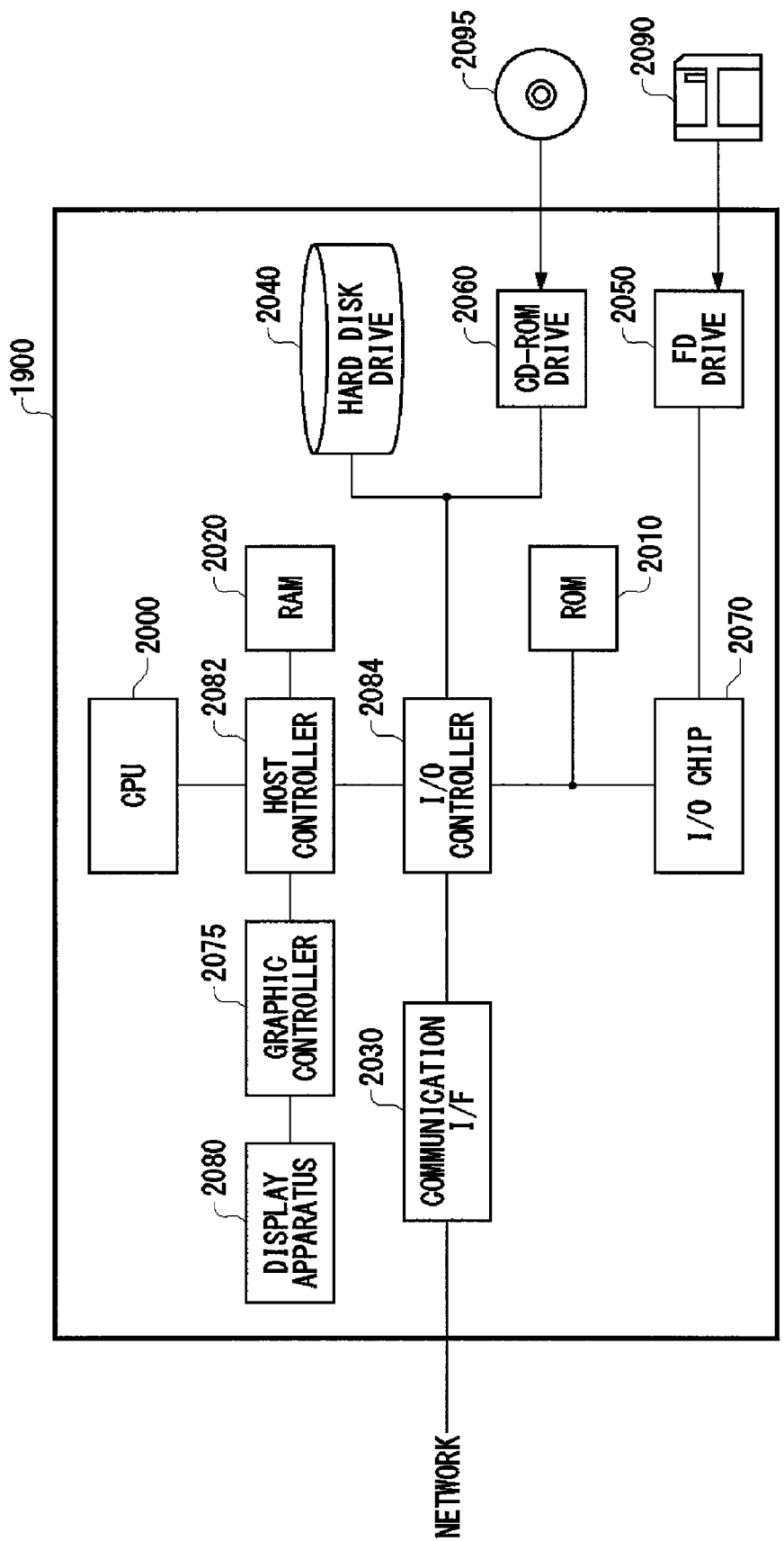
FIG. 11 shows an exemplary configuration of a computer 1900.

FIG. 11 shows an exemplary configuration of a computer 1900. The computer 1900 may function as the test vector generating unit 10 described in FIGS. 1 to 8, based on a program supplied thereto. For example, the computer 1900 may function as the partial pattern generating section 16, the testability judging section 18, the vector expanding section 12, the predicting section 22, the range determining section 24, the vector storage section 26, the test region detecting section 28, and the vector supplying section 14.

The computer 1900 according to the present embodiment is provided with a CPU peripheral including a CPU 2000, a RAM 2020, a graphic controller 2075, and a display apparatus 2080, all of which are connected to each other by a host controller 2082; an input/output section including a communication interface 2030, a hard disk drive 2040, and a CD-ROM drive 2060, all of which are connected to the host controller 2082 by an I/O controller 2084; and a legacy input/output section including a ROM 2010, a flexible disk drive 2050, and an input/output chip 2070, all of which are connected to the I/O controller 2084.

The host controller 2082 is connected to the RAM 2020 and is also connected to the CPU 2000 and graphic controller 2075 accessing the RAM 2020 at a high transfer rate. The CPU 2000 operates to control each section based on programs stored in the ROM 2010 and the RAM 2020. The graphic controller 2075 acquires image data generated by the CPU 2000 or the like on a frame buffer disposed inside the RAM 2020 and displays the image data in the display apparatus 2080. In addition, the graphic controller 2075 may internally include the frame buffer storing the image data generated by the CPU 2000 or the like.

The I/O controller 2084 connects the communication interface 2030 serving as a relatively high speed input/output apparatus, the hard disk drive 2040, and the CD-ROM drive 2060 to the host controller 2082. The communication interface 2030 communicates with other apparatuses via a network. The hard disk drive 2040 stores the programs and data used by the CPU 2000 housed in the computer 1900. The CD-ROM drive 2060 reads the programs and data from a CD-ROM 2095 and provides the read information to the hard disk drive 2040 via the RAM 2020.

Furthermore, the I/O controller 2084 is connected to the ROM 2010, and is also connected to the flexible disk drive 2050 and the input/output chip 2070 serving as a relatively high speed input/output apparatus. The ROM 2010 stores a boot program performed when the computer 1900 starts up, a program relying on the hardware of the computer 1900, and the like. The flexible disk drive 2050 reads programs or data from a flexible disk 2090 and supplies the read information to the hard disk drive 2040 via the RAM 2020. The input/output chip 2070 connects the flexible disk drive 2050 to each of the input/output apparatuses via, for example, a parallel port, a serial port, a keyboard port, a mouse port, or the like.

The programs provided to the hard disk drive 2040 via the RAM 2020 are stored in a storage medium, such as the flexible disk 2090, the CD-ROM 2095, or an IC card, and provided by a user. The programs are read from storage medium, installed in the hard disk drive 2040 inside the computer 1900 via the RAM 2020, and performed by the CPU 2000.

These programs are installed in the computer 1900. The programs may prompt the CPU 2000 or the like to cause the computer 1900 to function as the test vector generating unit 10. For example, these programs may cause the CPU 2000 to function as the partial pattern generating section 16, the testability judging section 18, the vector expanding section 12, the predicting section 22, the range determining section 24, the test region detecting section 28, and the vector supplying section 14. These programs may cause the RAM 2020 to function as the vector storage section 26.

The programs and modules shown above may also be stored in an external storage medium. The flexible disk 2090, the CD-ROM 2095, an optical storage medium such as a DVD or CD, a magneto-optical storage medium, a tape medium, a semiconductor memory such as an IC card, or the like can be used as the storage medium. Furthermore, a storage apparatus such as a hard disk or RAM that is provided with a server system connected to the Internet or a specialized communication network may be used to provide the programs to the computer 1900 via the network.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

As made clear from the above, by using the embodiments of the present invention, the degree to which the measured value of the leak current depends on the logic patterns of the test vectors can be decreased during testing of the device under test. Therefore, the device under test can be accurately tested.

What is claimed is:

1. A test apparatus that tests a device under test, comprising:
   a vector expanding section that sequentially generates a plurality of test vectors;
   a vector selecting section that selects test vectors that cause a prescribed characteristic of the device under test, which is to be measured when test signals that are each based on one of the test vectors are supplied to the device under test, to fulfill a preset condition, and the selected test vectors causing a fluctuation of the prescribed characteristic of the device under test to be decreased is in relation to the test vectors; and
   a judging section that judges pass/fail of the device under test based on measured values of the prescribed characteristic of the device under test supplied with the test signal based on the test vectors selected by the vector selecting section.

2. The test apparatus according to claim 1, wherein
   the vector selecting section calculates a plurality of predicted values of the prescribed characteristic to be measured when the test signal based on the test vectors are supplied to the device under test, by simulating an operation of the device under test being supplied with each test signal.

3. The test apparatus according to claim 2, wherein
   the vector selecting section selects test vectors corresponding to predicted values of the prescribed characteristic that are within a prescribed range; and
   the judging section acquires the measured values of the prescribed characteristic of the device under test and judges pass/fail of the device under test based on variance of the measured values.

4. The test apparatus according to claim 3, wherein
   the vector selecting section sets the prescribed range based on a predicted value having the highest occurrence rate, when the vector selecting section has calculated predicted values for a prescribed number of test vectors.

5. The test apparatus according to claim 3, wherein
   the vector selecting section sets the prescribed range based on a plurality of predicted values indicating a plurality of peaks in an occurrence rate, when the vector selecting section has calculated predicted values for a prescribed number of test vectors.

6. The test apparatus according to claim 3, wherein
   the device under test includes a plurality of CMOS circuits operating according to the test vectors,
   the vector selecting section selects test vectors based on predicted values of a quiescent current in the device under test supplied with the test signals based on the test vectors, and
   the judging section judges pass/fail of the device under test based on measured values of the quiescent current in the device under test supplied with the test signals.

7. The test apparatus according to claim 3, wherein the vector selecting section includes:
   a predicting section that calculates the predicted value for each test vector; and
   a vector storage section that stores test vectors corresponding to predicted values within the predetermined range.

8. The test apparatus according to claim 1, wherein
   the device under test is partitioned into a plurality of circuit blocks,
   the vector selecting section selects test vectors for each circuit block, and the judging section judges pass/fail of each circuit block based on a measured value of the prescribed characteristic of the circuit block.

9. The test apparatus according to claim 8, wherein the vector expanding section generates test vectors for each circuit block, in which logic patterns of bits corresponding to other circuit blocks are fixed.

10. The test apparatus according to claim 9, wherein, the vector expanding section generates test vectors for each circuit block, in which logic patterns of bits corresponding to other circuit blocks are fixed to be logic patterns causing a smallest amount of current to be consumed by the other circuit blocks.

11. The test apparatus according to claim 9, further comprising a partition generating section that partitions the device under test into the plurality of circuit blocks based on connection information supplied to the partition generating section concerning connections between circuit elements of the device under test.

12. A test apparatus that tests a device under test, comprising:

a vector expanding section that sequentially generates a plurality of test vectors;

a vector selecting section that selects test vectors that cause a prescribed characteristic of the device under test, which is to be measured when test signals that are each based on one of the test vectors are supplied to the device under test, to fulfill a preset condition, and calculates a plurality of predicted values of the prescribed characteristic to be measured when the test signal based on the test vectors are supplied to the device under test, by simulating an operation of the device under test being supplied with each test signal, and selects test vectors corresponding to predicted values of the prescribed characteristic that are within a prescribed range; the vector selecting section including:

a predicting section that calculates the predicted value for each test vector; and a vector storage section that stores test vectors corresponding to predicted values within the predetermined range;

a judging section that judges pass/fail of the device under test based on measured values of the prescribed characteristic of the device under test supplied with the test signal based on the test vectors selected by the vector selecting section, and acquires the measured values of the prescribed characteristic of the device under test and judges pass/fail of the device under test based on variance of the measured values; and a partial pattern generating section that generates a plurality of partial patterns specifying logic values of bits in the test vectors that cause a predetermined circuit block, from among a plurality of circuit blocks, of the device under test to operate, wherein the vector expanding section sequentially generates test vectors that each include a partial pattern generated by the partial pattern generating section but have overall patterns differing from each other, and the predicting section selects test vectors expanded by the vector expanding section that correspond to predicted values within the predetermined range, and stores the selected test vectors in the vector storage section as test vectors for testing the circuit block.

13. The test apparatus according to claim 12, further comprising a test region detecting section that detects a circuit block, other than the circuit block corresponding to the partial pattern, that can be tested by the test vectors selected by the predicting section, and stores the test vectors in the storage section as test vectors that can also test said circuit block.

14. The test apparatus according to claim 12, wherein the vector expanding section sequentially generates, for each partial pattern, different test vectors until a test vector corresponding to a predicted value in the predetermined range is extracted or until a number of test vectors generated based on the partial pattern reaches a prescribed amount.

15. The test apparatus according to claim 12, wherein the partial pattern generating section further generates a different partial pattern for the circuit block if none of the predicted values corresponding to the test vectors expanded by the vector expanding section are within the predetermined range.

16. The test apparatus according to claim 15, wherein the partial pattern generating section sequentially generates, for each circuit block, different partial patterns until a test vector corresponding to a predicted value in the predetermined range is extracted or until a number of generated partial patterns reaches a prescribed amount.

17. A test vector generating unit that generates a plurality of test vectors for a test apparatus that judges pass/fail of a device under test by measuring a prescribed characteristic of the device under test supplied with test signals that each correspond to a test vector, the test vector generating unit comprising:

a vector expanding section that sequentially generates the plurality of test vectors; and a vector selecting section that selects test vectors for testing the device under test that cause the prescribed characteristic of the device under test, which is to be measured when test signals corresponding to the test vectors are supplied to the device under test, to fulfill a preset condition, and the selected test vectors causing a fluctuation of the prescribed characteristic of the device under test to be decreased is in relation to the test vectors.

18. A method for testing a device under test, comprising the steps of:

sequentially generating a plurality of test vectors;

selecting test vectors that cause a prescribed characteristic of the device under test, which is to be measured when test signals that are each based on one of the test vectors are supplied to the device under test, to fulfill a preset condition, and the selected test vectors causing a fluctuation of the prescribed characteristic of the device under test to be decreased is in relation to the test vectors;

supplying the device under test with test signals based on the selected test vectors; and judging pass/fail of the device under test based on measured values of the prescribed characteristic of the device under test supplied with the test signals.

19. A method that causes a test vector generating unit to:

generate a plurality of test vectors for a test apparatus that judges pass/fail of a device under test by measuring a prescribed characteristic of the device under test supplied with test signals that each correspond to a test vector;

function as a vector expanding section that sequentially generates the plurality of test vectors; and function as a vector selecting section that selects test vectors for testing the device under test that cause the prescribed characteristic of the device under test, which is to be measured when test signals corresponding to the test vectors are supplied to the device under test, to fulfill a preset condition, and the selected test vectors causing a fluctuation of the prescribed characteristic of the device under test to be decreased is in relation to the test vectors.

20. A recording medium that stores a program executing the method according to claim 19.

* * * * *